(12) United States Patent
Jeon

(10) Patent No.: US 9,997,048 B2
(45) Date of Patent: Jun. 12, 2018

(54) POWER FAILURE MONITORING DEVICE OF DIGITAL PROTECTION RELAY

(71) Applicant: LSIS CO., LTD., Gyeonggi-do (KR)

(72) Inventor: Byung-Joon Jeon, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days. days.

(21) Appl. No.: 15/215,493

(22) Filed: Jul. 20, 2016

(65) Prior Publication Data

US 2017/0032654 A1 Feb. 2, 2017

(30) Foreign Application Priority Data

Jul. 28, 2015 (KR) .................. 10-2015-0106803

(51) Int. Cl.
| | |
|---|---|
| G08B 21/18 | (2006.01) |
| H02H 3/00 | (2006.01) |
| H02H 3/04 | (2006.01) |
| H02H 3/05 | (2006.01) |
| G01R 19/165 | (2006.01) |

(52) U.S. Cl.
CPC ......... *G08B 21/185* (2013.01); *G01R 19/165* (2013.01); *H02H 3/006* (2013.01); *H02H 3/044* (2013.01); *H02H 3/05* (2013.01)

(58) Field of Classification Search
CPC .......... G08B 21/185; G01R 19/165–19/16595; H02H 3/006; H02H 3/044; H02H 3/05
See application file for complete search history.

(56) References Cited

U.S. PATENT DOCUMENTS

| | | | | |
|---|---|---|---|---|
| 5,248,967 A | * | 9/1993 | Daneshfar | G08G 1/097 315/130 |
| 5,959,537 A | * | 9/1999 | Banting | H02H 3/04 324/133 |
| 7,034,707 B2 | * | 4/2006 | Aisa | H02J 3/14 340/538 |
| 8,738,195 B2 | * | 5/2014 | Aldridge | G06N 5/04 340/12.32 |
| 2002/0159211 A1 | | 10/2002 | Maeda | |
| 2004/0021577 A1 | * | 2/2004 | Lelecas | G08B 21/185 340/654 |
| 2008/0258558 A1 | * | 10/2008 | Lathrop | H02J 3/14 307/29 |

(Continued)

FOREIGN PATENT DOCUMENTS

| | | |
|---|---|---|
| EP | 2549608 A1 | 1/2013 |
| EP | 2887482 A1 | 6/2015 |

(Continued)

OTHER PUBLICATIONS

European Search Report dated Nov. 2, 2016 corresponding to Application No. 16175051.8-1806.

*Primary Examiner* — Nay Tun
(74) *Attorney, Agent, or Firm* — K&L Gates LLP

(57) ABSTRACT

Embodiments of a power failure monitoring device of a digital protection relay capable of preventing a relay operation error and a data loss by determining a power failure when an electric power voltage being detected is dropped to be equal to or less than a prestored power failure reference voltage to enable a controller to perform a power failure preparation operation are provided.

5 Claims, 4 Drawing Sheets

(56) References Cited

U.S. PATENT DOCUMENTS

| | | | |
|---|---|---|---|
| 2009/0085759 A1* | 4/2009 | Lindsey | G01R 19/16542 340/660 |
| 2010/0052929 A1* | 3/2010 | Jackett | G01R 29/085 340/660 |
| 2011/0128005 A1* | 6/2011 | Weiher | H02H 3/044 324/424 |
| 2011/0181431 A1* | 7/2011 | Koehl | F04D 15/0088 340/660 |
| 2013/0073232 A1* | 3/2013 | Billingsley | G01R 19/2513 702/61 |
| 2015/0077132 A1* | 3/2015 | Watahiki | G01R 19/1659 324/537 |

FOREIGN PATENT DOCUMENTS

| | | |
|---|---|---|
| JP | H1155844 A | 2/1999 |
| JP | H11178192 A | 7/1999 |
| JP | 2000166082 A | 6/2000 |
| JP | 2001112158 A | 4/2001 |
| JP | 2002051447 A | 2/2002 |
| JP | 2005006448 A | 1/2005 |
| JP | 4118422 B2 | 7/2008 |
| KR | 1019990085704 A | 12/1999 |
| KR | 1020040100533 A | 12/2004 |
| KR | 1020050101889 A | 10/2005 |
| KR | 101331999 B1 | 11/2013 |
| KR | 101437340 B1 | 9/2014 |
| KR | 101451389 B1 | 10/2014 |

\* cited by examiner

POWER FAILURE MONITORING DEVICE OF DIGITAL PROTECTION RELAY

CROSS REFERENCE TO RELATED APPLICATIONS

This application claims the benefit of Korean Patent Application No. 10-2015-0106803, filed on Jul. 28, 2015 and entitled "POWER FAILURE MONITORING APPARATUS FOR DIGITAL PROTECTING RELAY", which is hereby incorporated by reference in its entirety.

BACKGROUND

Technical Field

The present disclosure relates to a digital protection relay, and more particularly, to a power failure monitoring device of a digital protection relay.

Description of the Related Art

A digital protection relay receives a variety of analog information (for example, a detected voltage, a detected current and the like of an electric power circuit) and a digital input from an electric power system to determine whether or not an abnormality of the electric power system occurs. The digital protection relay is a protection device of the electric power system so as to rapidly resolve an abnormality when occurring in the electric power system by controlling a circuit breaker connected to the digital protection relay to operate to a trip position (a circuit breaker position) when the abnormality is detected.

When such a digital protection relay operates, a power failure occurs so that a central processing unit of a controller, which performs an operation processing, is shut down. Consequently, when a malfunction of the digital protection relay occurs, this may cause an accident of an electric power system so that a power failure monitoring should be treated as an important subject and a countermeasure therefor may be needed.

In such a digital protection relay, a power failure monitoring device according to the related art will be described with reference to FIG. 1.

A power failure monitoring device according to the related art is configured to include an alternating current (AC) electric power input unit (hereinafter, referred to as an AC electric power input unit) 10, a direct current (DC) electric power converter (hereinafter, referred to as a DC electric power converter) 11, a voltage divider 12, and a controller 13.

The AC electric power input unit 10 may be configured with a transformer which is connected to an AC power supply, for example, such as a normal commercial AC power supply, providing a voltage in a range of 100 to 260 volts (V) to perform a voltage drop on an AC voltage provided therefrom to provide the dropped AC voltage.

Output terminals of the AC electric power input unit 10 are connected in parallel to the DC electric power converter 11 and the voltage divider 12 to provide the dropped AC voltage thereto.

The DC electric power converter 11 is configured with a rectification circuit, for example, such as a diode bridge to rectify an AC electric power from the AC electric power input unit 10 and to convert the rectified AC electric power into a DC electric power, thereby providing the controller 13 with the DC electric power as a DC power source.

The voltage divider 12 is configured with a plurality of voltage dividing resistors to divide the AC voltage from the AC electric power input unit 10 into a voltage which is a fraction of the AC voltage, thereby providing the controller 13 with the voltage as a voltage signal representing a voltage of the AC electric power.

The controller 13 may be configured with, for example, a microcomputer including a central processing unit and a memory to compare a set reference voltage value prestored in the memory with a voltage value of the voltage signal provided from the voltage divider 12.

As the comparison result, if the voltage value of the voltage signal provided from the voltage divider 12 is less than the set reference voltage value, the controller 13 determines that a power failure occurs. Thereafter, the central processing unit included in the controller 13 safely terminates an ongoing work (process) and stores data prior to the occurrence of the power failure in the memory to securely maintain information regarding a state prior to the power failure.

In the power failure monitoring device according to the related art as described above in detail, however, the set reference voltage value is a single value which has been input to be corresponded to a voltage of a single power supply in a factory upon manufacturing the digital protection relay. Therefore, when the digital protection relay to which the set reference voltage value is input is used under a circumstance at which a voltage of a power supply is changed, there may be a problem in which the power failure monitoring device according to the related art could not recognize a power failure to cause an error.

SUMMARY

Therefore, to address the problems described above, an object of some embodiments of the present disclosure is to provide a power failure monitoring device of a digital protection relay capable of preventing a relay operation error and a data loss by automatically determining and storing a power failure reference voltage regardless of a usage electric power voltage based on a preset rated electric power voltage and a power failure determination reference ratio with respect thereto, and determining a power failure when a magnitude of an electric power voltage being input is dropped to be equal to or less than the power failure reference voltage to enable a controller to perform a power failure preparation operation.

The object of some embodiments of the present disclosure may be attained by providing a power failure monitoring device of a digital protection relay including a voltage transforming unit configured to drop a voltage of an alternating current (AC) electric power to provide an electric power voltage signal representing an electric power voltage value, and a controller configured to compute and store a power failure reference voltage based on a preset rated electric power voltage and a power failure reference ratio with respect thereto, and to compare the electric power voltage value, which is represented by the electric power voltage signal provided from the voltage transforming unit, with the stored power failure reference voltage to determine a power failure when the electric power voltage value is not greater than the stored power failure reference voltage.

According to one aspect of some embodiments of the present disclosure, the voltage transforming unit may be configured with a potential transformer dropping and providing the voltage of the AC electric power, or a voltage divider.

According to another aspect of some embodiments of the present disclosure, the power failure monitoring device of the digital protection relay according to some embodiments of the present disclosure further includes a filter circuit configured to eliminate noise which is mixed with the electric power voltage signal provided from the voltage transforming unit, and an analog-digital converter connected to the filter circuit and configured to convert an analog electric power voltage signal, which is output from the filter circuit and from which the noise is eliminated, into a digital signal to provide the controller with the digital signal.

According to still another aspect of some embodiments of the present disclosure, the controller includes a central processing unit configured to perform a process and control operation including a determination of the power failure when the electric power voltage value is not greater than the power failure reference voltage, a setting input unit configured to enable a user to set a rated electric power voltage and a power failure determination reference ratio with respect thereto, and to provide setting data including the rated electric power voltage and the power failure determination reference ratio with respect to the rated electric power voltage which are set by the user, a memory configured to store the setting data under a control of the central processing unit, and a display configured to display an occurrence of the power failure and to provide a display screen for an input of a setting value under the control of the central processing unit.

The power failure monitoring device of the digital protection relay according to some embodiments of the present disclosure may compute and store a power failure reference voltage based on a preset rated electric power voltage and a power failure determination reference ratio with respect thereto if a user presets the rated electric power voltage and the power failure determination reference ratio with respect thereto. Therefore, under an installation circumstance in which a magnitude of a rated electric power voltage is different from a value set upon manufacturing a digital protection relay, a power failure reference voltage may be automatically and accurately computed and stored. Also, by comparing the electric power voltage value to be detected with the stored power failure reference voltage, a power failure may be accurately determined when the electric power voltage value is not greater than the stored power failure reference voltage. Consequently, an occurrence of a relay operation error of the digital protection relay may be prevented and a work prior to the power failure may be safely terminated to store data, so that it may be possible to provide effectiveness in which a restoration operation of the power failure may be rapidly performed.

In some embodiments of the present disclosure, the voltage transforming unit is configured with the potential transformer dropping and providing the voltage of the AC electric power, or the voltage divider, so that it may be possible to obtain effectiveness in which the electric power voltage value may be converted into a voltage detection signal being proportional thereto to provide the controller with the voltage detection signal.

The power failure monitoring device of the digital protection relay according to some embodiments of the present disclosure further includes the filter circuit and the analog-digital converter, so that there may be effectiveness in which noise to be mixed with the electric power voltage signal provided from the voltage transforming unit may be eliminated, and an analog electric power voltage signal from which the noise is eliminated may be converted into a digital signal to provide the controller with the digital signal.

According to yet another aspect of some embodiments of the present disclosure, the controller includes the central processing unit to enable a process and control operation including a determination of a power failure when the electric power voltage value is not greater than the power failure reference voltage, and includes the setting input unit to provide a means for enabling a user to set a rated electric power voltage and a power failure determination reference ratio with respect thereto, so that there may be effectiveness in which a flexible action against an installation circumstance change of a digital protection relay may be possible by flexibly setting up setting reference data, setting data may be stored and provided to the central processing unit by including the memory, and an occurrence of a power failure may be displayed or a display screen for some embodiments of an input of a setting value may be provided by including the display.

DETAILED DESCRIPTION

Figure 1:
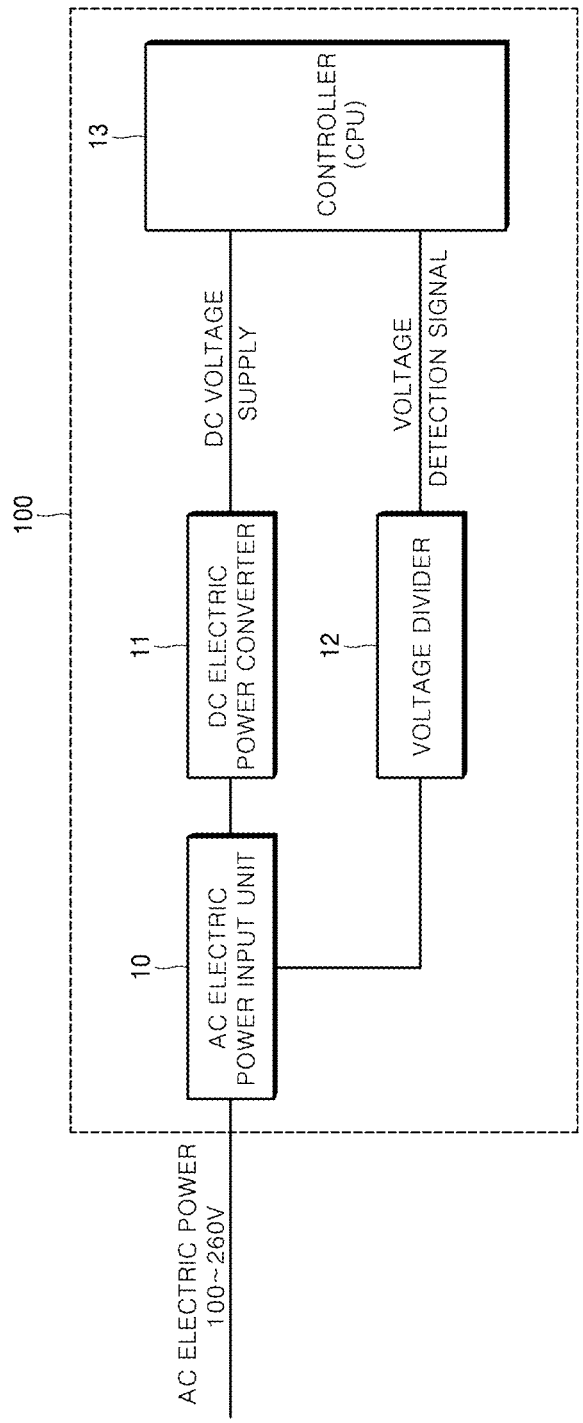
FIG. 1 is a block diagram illustrating a configuration of a power failure monitoring device of a digital protection relay according to the prior art.
Figure 2:
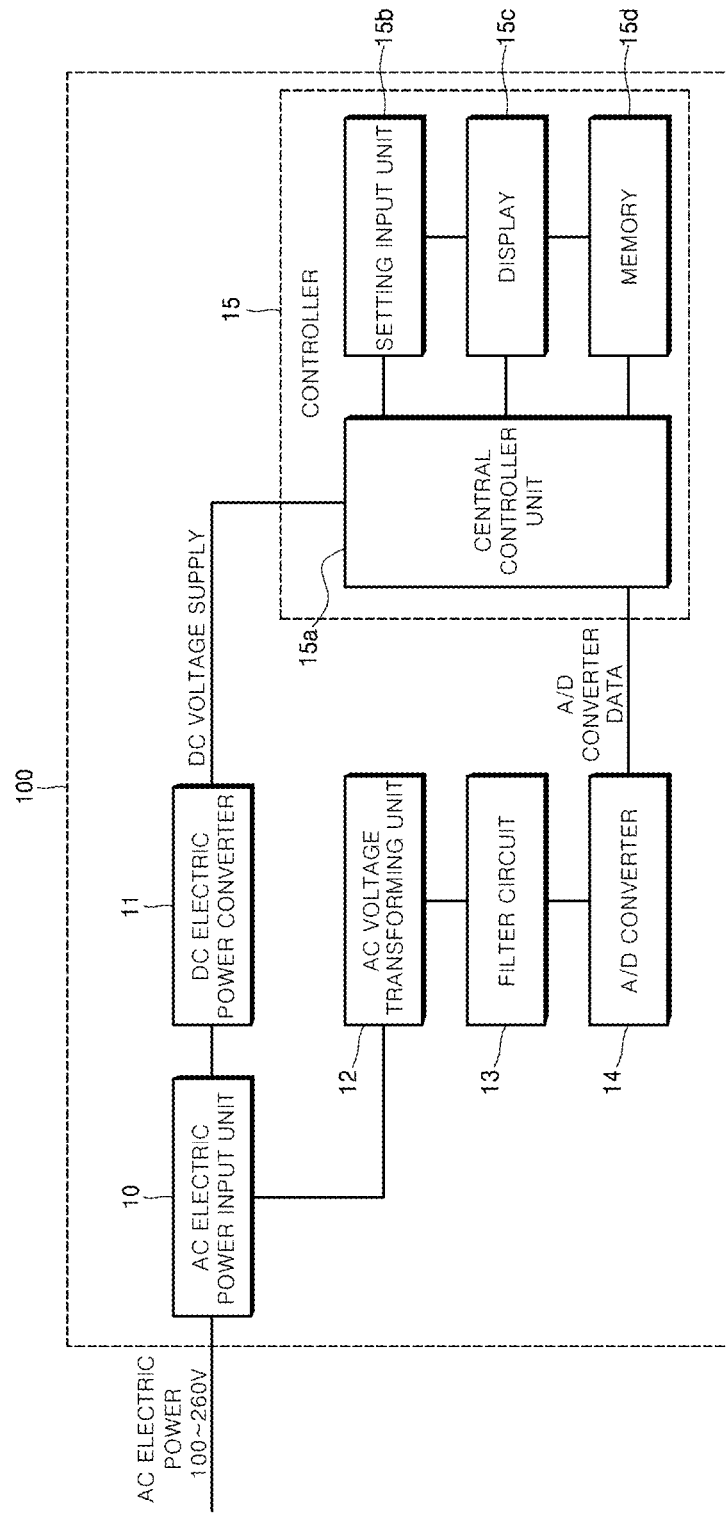
FIG. 2 is a block diagram illustrating a configuration of a power failure monitoring device of a digital protection relay according to an embodiment of the present disclosure.
Figure 3:
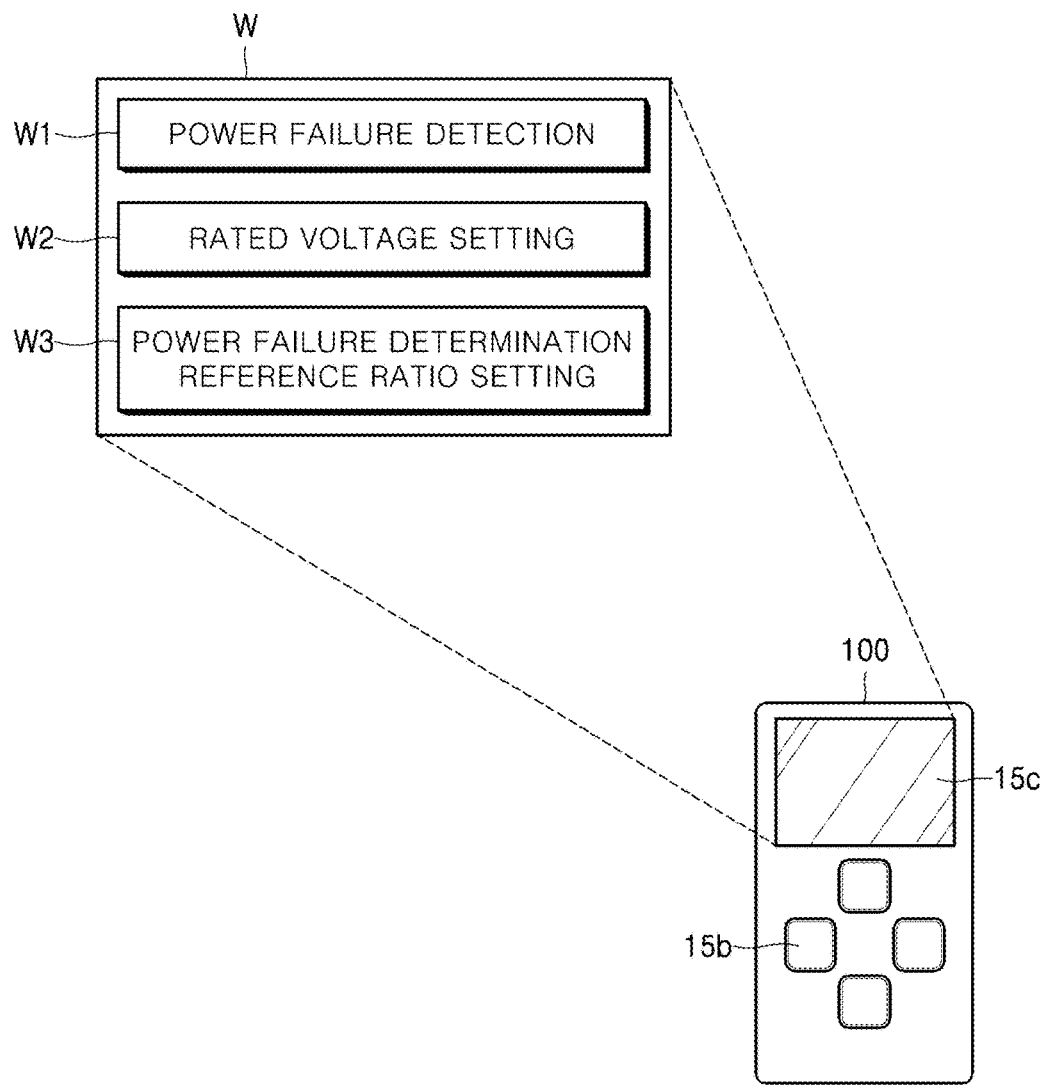
FIG. 3 is a diagram illustrating external appearance configurations of a display and a key switch as a setting input unit and an example of a display screen of the display of the power failure monitoring device of the digital protection relay according to an embodiment of the present disclosure.

The objects described above, and configurations and effectiveness for attaining the objects of the present disclosure will be understood more apparently by describing in detail embodiments thereof with reference to the accompanying drawings Firstly, with reference to FIG. 2 which is a block diagram illustrating a configuration of a power failure monitoring device of a digital protection relay according to a embodiment of the present disclosure, and FIG. 3 which is a diagram illustrating external appearance configurations of a display and a key switch as a setting input unit and an example of a display screen of the display of the power failure monitoring device of the digital protection relay according to the embodiment of the present disclosure, a configuration of a power failure monitoring device of a digital protection relay according to the embodiment of the present disclosure will be described.

With reference to FIG. 2, a power failure monitoring device of a digital protection relay 100 according to the embodiment of the present disclosure is configured to include a voltage transforming unit (hereinafter, referred to as an alternating current (AC) voltage transforming unit) 12 and a controller 15.

The power failure monitoring device of the digital protection relay 100 according to the embodiment of the present disclosure may further include an AC electric power input unit 10 and a DC electric power converter 11.

The AC electric power input unit 10 may be a circuit for dropping and providing a voltage of an AC electric power in a range of, for example, 110 to 220 volts (V) to a voltage including several volts, and may be configured to include a voltage transforming unit dropping a voltage.

The DC electric power converter 11 may be a circuit for converting the dropped AC electric power provided from the AC electric power input unit 10 into a DC electric power, and may be configured with a rectification circuit such as, for example, a diode bridge.

The DC electric power provided from the DC electric power converter 11 may be supplied to the controller 15 as a power source.

The AC voltage transforming unit 12 is a circuit which provides an electric power voltage signal representing an electric power voltage value.

According to the embodiment, a transforming circuit of the AC voltage transforming unit 12 may be configured with a potential transformer detecting and providing the voltage of the AC electric power, or a voltage divider.

The controller 15 computes and stores a power failure reference voltage based on a preset rated electric power voltage and a power failure determination reference ratio with respect thereto.

Also, the controller 15 compares the electric power voltage value, which is represented by the electric power voltage signal provided from the AC voltage transforming unit 12, with the stored power failure reference voltage to determine a power failure when the electric power voltage value is not greater than the power failure reference voltage.

In other words, the controller 15 determines the power failure when the electric power voltage value is equal to or less than the power failure reference voltage.

With reference to FIG. 2, the power failure monitoring device 100 of a digital protection relay according to the embodiment of the present disclosure may further include a filter circuit 13 and an analog-digital converter 14.

The filter circuit 13 may be configured with, for example, a low pass filter to eliminate noise (especially, a high frequency noise) which can be mixed with the electric power voltage signal provided from the AC voltage transforming unit 12.

The analog-digital converter 14 is a means which is connected to the filter circuit 13 and converts the analog electric power voltage signal from which noise has been eliminated and output from the filter circuit 13 into a digital signal, thereby providing the controller 15 with the digital signal.

With reference to FIG. 2, the controller 15 may be configured to include a central processing unit 15a, a setting input unit 15b, a memory 15d, and a display 15c.

The central processing unit (CPU) 15a performs a process and control operation including a determination of a power failure when the electric power voltage value is not greater than the power failure reference voltage.

The setting input unit 15b may provide a means which enables a user to set a rated electric power voltage and a power failure determination reference ratio with respect thereto.

According to one embodiment, the setting input unit 15b may be configured with a key switch or a key pad.

Alternatively, the setting input unit 15b may be configured with a touch panel or a touch pad, and may be configured with a variety of input means as a user interface means.

Here, the power failure determination reference ratio with respect to the rated electric power voltage may be input by a manipulation of the user through the setting input unit 15b with 80% of the rated electric power voltage according to one embodiment, and may be stored in the memory 15d under a control of the central processing unit 15a. However, the power failure determination reference ratio of 80% with respect to the rated electric power voltage may be merely one embodiment, and a variety of setting examples such as 75%, 82%, 85% and the like may be possible according to a user's selection.

When the electric power voltage value detected and input by the AC voltage transforming unit 12 is equal to or less than, e.g., 88 volts stored as the power failure determination reference ratio of 80% with respect to the rated electric power voltage of, e.g., 110 volts, the central processing unit 15a may determine a power failure.

The memory 15d may be a means for storing the setting data under the control of the central processing unit 15a, and may be configured with a nonvolatile memory such as a flash memory, an electrically erasable and programmable read only memory (EEPROM) and the like according to the embodiment.

The display 15c is a means for displaying an occurrence of the power failure or a display screen for an input of a setting value. According to the embodiment, the display 15c may be configured with a liquid crystal display.

FIG. 3 is a diagram illustrating external appearance configurations of the display and a key switch as a setting input unit and an example of a display screen of the display of the power failure monitoring device of the digital protection relay according to the embodiment of the present disclosure.

With reference to FIG. 3, the setting input unit 15b of the digital protection relay 100 may be configured with a key switch, and the key switch may be configured to include direction key (for example, upward and downward direction keys) switches, a selection key switch (an enter key switch) and the like.

As shown in FIG. 3, a display screen W of the display 15c may include a power failure detection display window W1, a rated voltage setting display window W2, and a power failure determination reference ratio setting display window W3.

According to the embodiment, the power failure detection display window W1 may be configured to flicker or vary in color when a power failure occurs to alarm the occurrence of the power failure.

For example, the power failure detection display window W1 may be configured to alarm an occurrence of a power failure by varying from green to red in color Alternatively, when the power failure occurs, the power failure detection display window W1 may be configured to alarm the occurrence of the power failure by flickering and varying in color at the same time.

The rated voltage setting display window W2 may be a menu window capable of setting a rated voltage. The rated voltage setting display window W2 may be configured by a program capable of switching a display screen to a display and input window (not shown) for setting a rated voltage when a user selects the menu window through a manipulation of the setting input unit 15b, thereby enabling the user to set the rated voltage.

The power failure determination reference ratio setting display window W3 may be a menu window capable of allowing a user to set a reference ratio (a boundary ratio) for determining a power failure with respect to the rated voltage. The power failure determination reference ratio setting display window W3 may be configured by a program capable of switching the display screen to a display and input window (not shown) for setting a power failure determination reference ratio when the user selects the menu window through the manipulation of the setting input unit 15b, thereby enabling the user to set the reference ratio.

As described above, the reference ratio may be set to, for example, 80% with respect to the rated voltage.

Figure 4:
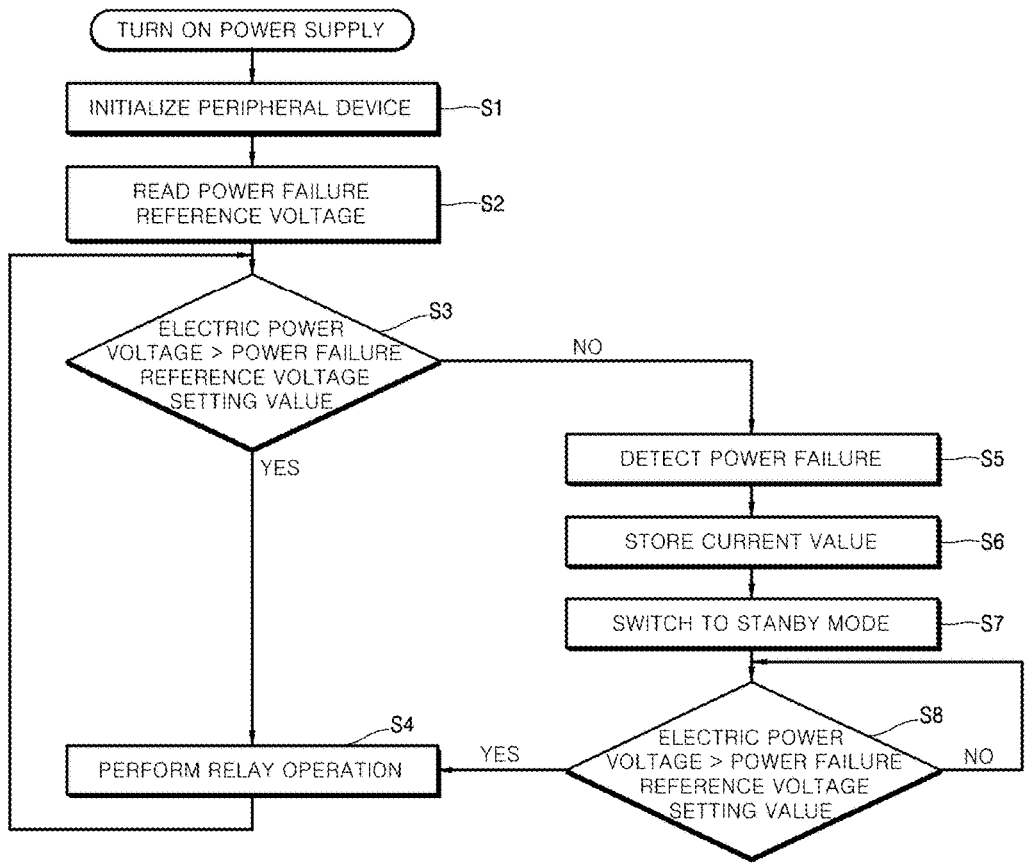
FIG. 4 is a flow chart illustrating a control operation and a monitoring method of the power failure monitoring device of the digital protection relay according to an embodiment of the present disclosure.

Hereinafter, referring mainly to FIG. 4 and referring subsidiarily to FIGS. 2 and 3, an operation and a measuring method of the power failure measuring device of the digital protection relay configured as described above according to the embodiment will be described.

Firstly, the central processing unit 15a of the controller 15 initializes peripheral devices (interfaces) in Operation S1.

After, in Operation S2, the central processing unit 15a of the controller 15 reads a power failure reference voltage value stored in the memory 15d. Also, in Operation S2, the central processing unit 15a of the controller 15 receives a detected electric power voltage value according to a digital electric power voltage signal, wherein the digital electric power voltage signal is detected by the AC voltage transforming unit 12 to be converted into a digital signal by the analog-digital converter 14 and noise is eliminated from the digital electric power voltage signal by the filter circuit 13.

Next, in Operation S3, the central processing unit 15a of the controller 15 compares the power failure reference voltage value read in Operation S2 with the detected electric power voltage value.

If the detected electric power voltage value is greater than the power failure reference voltage value in Operation S3, the central processing unit 15a of the controller 15 proceeds to Operation S4 to perform a relay operation including a monitoring of an abnormal current generation in a circuit of the digital protection relay 100.

Otherwise, if the detected electric power voltage is equal to or less than the power failure reference voltage value in Operation S3, the central processing unit 15a of the controller 15 proceeds to Operation S5 to determine a power failure and to control the display 15c to make the power failure detection display window W1 flicker, thereby displaying an occurrence of the power failure.

Next, in Operation S6, the central processing unit 15a of the controller 15 stores a current value (for example, the detected current value in the circuit), which is currently processed by the digital protection relay 100, in the memory 15d.

Thereafter, in Operation S7, the central processing unit 15a of the controller 15 is switched to a standby mode, and monitors whether or not the detected electric power voltage value is greater than the power failure reference voltage value in Operation S8.

If the detected electric power voltage value is greater than the power failure reference voltage value in Operation S8, the central processing unit 15a of the controller 15 proceeds to Operation S4 to perform the relay operation including the monitoring of the abnormal current generation in the circuit of the digital protection relay 100.

Otherwise, if the detected electric power voltage is equal to or less than the power failure reference voltage value in Operation S8, a state of the power failure is ongoing so that the central processing unit 15a of the controller 15 maintains a monitoring state whether or not the detected electric power voltage is greater than the power failure reference voltage value.

As described above in detail, the power failure monitoring device of the digital protection relay according to some embodiments of the present disclosure may compute and store the power failure reference voltage based on the preset rated electric power voltage and the power failure determination reference ratio with respect thereto if the user presets the rated electric power voltage and the power failure determination reference ratio with respect thereto.

Therefore, under an installation circumstance in which a magnitude of the rated electric power voltage is different from a value set upon manufacturing the digital protection relay, a power failure reference voltage may be automatically and accurately computed and stored. Also, by comparing the electric power voltage value to be detected with the stored power failure reference voltage, the power failure may be accurately determined when the electric power voltage value is not greater than the stored power failure reference voltage. Consequently, an occurrence of a relay operation error of the digital protection relay may be prevented and a work prior to the power failure may be safely terminated to store data, so that it may be possible to provide effectiveness in which a restoration operation of the power failure may be rapidly performed.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A power failure monitoring device of a digital protection relay, comprising:
a voltage divider to drop a voltage of an alternating current (AC) electric power to provide an electric power voltage signal representing an electric power voltage value;
a controller to compute and store a power failure reference voltage based on a preset rated electric power voltage and a power failure determination reference ratio and to compare the electric power voltage value, which is represented by the electric power voltage signal provided from the voltage divider, with the stored power failure reference voltage to determine a power failure when the electric power voltage value is not greater than the stored power failure reference voltage; and
a setting display window allowing a user to set the power failure determination reference ratio,
wherein the power failure determination reference ratio is a boundary ratio for determining a power failure with respect to the preset rated electric power voltage,
wherein the controller includes a central processing unit to perform a process and control operation including a determination of the power failure, and
wherein the central processing unit stores a detected electrical current value, which is currently processed by the digital protection relay, in a memory.

2. The power failure monitoring device of the digital protection relay of claim 1, wherein the voltage divider is further configured with a potential transformer to drop and provide the voltage of the AC electric power.

3. The power failure monitoring device of the digital protection relay of claim 1, further comprising:
- a filter circuit configured to reduce noise which is mixed with the electric power voltage signal provided from the voltage divider; and
- an analog-digital converter configured to be connected to the filter circuit and configured to convert an analog electric power voltage signal, which is output from the filter circuit and from which the noise is reduced, into a digital signal to provide the controller with the digital signal.

4. The power failure monitoring device of the digital protection relay of claim 1, wherein:

the controller includes a touch pad to enable a user to set the preset rated electric power voltage and the power failure determination reference ratio, and to provide setting data including the preset rated electric power voltage and the power failure determination reference ratio, which are set by the user;

wherein the memory is configured to store the setting data under a control of the central processing unit; and wherein the controller includes a display configured to display an occurrence of the power failure and to provide a display screen for an input of a setting value under the control of the central processing unit.

5. The power failure monitoring device of the digital protection relay of claim 4, wherein the display is further configured to alarm the occurrence of the power failure by making a display window flicker, vary in color, or flicker and vary in color under the control of the controller.

* * * * *